(12) United States Patent
Elers et al.

(10) Patent No.: US 7,595,270 B2
(45) Date of Patent: Sep. 29, 2009

(54) PASSIVATED STOICHIOMETRIC METAL NITRIDE FILMS

(75) Inventors: Kai-Erik Elers, Vantaa (FI); Steven Marcus, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 134 days.

(21) Appl. No.: 11/627,597

(22) Filed: Jan. 26, 2007

(65) Prior Publication Data

US 2008/0182410 A1 Jul. 31, 2008

(51) Int. Cl.
 *H01L 21/31* (2006.01)
 *H01L 23/48* (2006.01)
(52) U.S. Cl. .............. 438/785; 438/778; 438/685; 257/761
(58) Field of Classification Search .......... 438/683, 438/685, 648, 785, 778; 257/750, 751, 761
See application file for complete search history.

(56) References Cited

U.S. PATENT DOCUMENTS

| | | | |
|---|---|---|---|
| 4,058,430 A | 11/1977 | Suntola et al. | |
| 4,282,267 A | 8/1981 | Kuyel | |
| 4,389,973 A | 6/1983 | Suntola et al. | |
| 4,747,367 A | 5/1988 | Posa | |
| 4,761,269 A | 8/1988 | Conger et al. | |
| 4,767,494 A | 8/1988 | Kobayashi et al. | |
| 4,851,095 A | 7/1989 | Scobey et al. | |
| 4,935,661 A | 6/1990 | Heinecke et al. | |
| 5,071,670 A | 12/1991 | Kelly | |
| 5,166,092 A | 11/1992 | Mochizuki et al. | |
| 5,221,556 A | 6/1993 | Hawkins et al. | |
| 5,270,247 A | 12/1993 | Sakuma et al. | |
| 5,342,652 A | 8/1994 | Foster et al. | |
| 5,356,673 A | 10/1994 | Schmitt et al. | |
| 5,443,647 A | 8/1995 | Aucoin et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |

(Continued)

FOREIGN PATENT DOCUMENTS

EP  0 442 490 A1  12/1991

(Continued)

OTHER PUBLICATIONS

Elers et al., "NbCl5 as a precursor in atomic layer epitaxy," Applied Surface Science, 82/83:468-474 (1994).

(Continued)

*Primary Examiner*—Kevin M Picardat
(74) *Attorney, Agent, or Firm*—Knobbe, Martens, Olson & Bear, LLP

(57) ABSTRACT

Methods for forming passivated stoichiometric metal nitride films are provided along with structures incorporating such films. The preferred methods include contacting a substrate with alternating and sequential pulses of a metal source chemical, one or more plasma-excited species of hydrogen and a nitrogen source chemical to form a stoichiometric metal nitride film, followed by exposure of the stoichiometric metal nitride film to a source chemical of a passivating species to form a passivation layer over the stoichiometric metal nitride film.

45 Claims, 2 Drawing Sheets

U.S. PATENT DOCUMENTS

| | | | |
|---|---|---|---|
| 5,769,950 | A | 6/1998 | Takasu et al. |
| 5,855,680 | A | 1/1999 | Soininen et al. |
| 5,916,365 | A | 6/1999 | Sherman |
| 5,961,365 | A | 10/1999 | Lambert |
| 5,973,400 | A | 10/1999 | Murakami |
| 6,015,590 | A | 1/2000 | Suntola et al. |
| 6,104,074 | A | 8/2000 | Chen |
| 6,113,977 | A | 9/2000 | Soininen et al. |
| 6,139,700 | A | 10/2000 | Kang et al. |
| 6,188,134 | B1 | 2/2001 | Stumborg et al. |
| 6,200,389 | B1 | 3/2001 | Miller et al. |
| 6,200,893 | B1 | 3/2001 | Sneh |
| 6,203,613 | B1 | 3/2001 | Gates et al. |
| 6,270,572 | B1 | 8/2001 | Kim et al. |
| 6,342,277 | B1 | 1/2002 | Sherman |
| 6,482,262 | B1 | 11/2002 | Elers et al. |
| 6,511,539 | B1 | 1/2003 | Raaijmakers |
| 6,800,383 | B1 | 10/2004 | Lakhotkin |
| 6,838,125 | B2 | 1/2005 | Chung et al. |
| 6,863,727 | B1 | 3/2005 | Elers et al. |
| 6,936,535 | B2 | 8/2005 | Kim et al. |
| 7,144,806 | B1 | 12/2006 | Fair et al. |
| 7,211,507 | B2 | 5/2007 | Dunn et al |
| 7,235,482 | B2 * | 6/2007 | Wu et al. .................. 438/674 |
| 2003/0219942 | A1 | 11/2003 | Choi et al. |
| 2004/0231799 | A1 | 11/2004 | Lee et al. |
| 2005/0095443 | A1 | 5/2005 | Kim et al. |
| 2006/0019494 | A1 * | 1/2006 | Cao et al. .................. 438/680 |
| 2006/0063395 | A1 | 3/2006 | Lee |
| 2006/0211224 | A1 | 9/2006 | Matsuda |
| 2006/0251812 | A1 | 11/2006 | Kang et al. |

FOREIGN PATENT DOCUMENTS

| | | |
|---|---|---|
| EP | 0 528 779 A1 | 2/1993 |
| EP | 0 442 490 B1 | 5/1995 |
| EP | 0 526 779 B1 | 10/1995 |
| EP | 0 528 779 B1 | 10/1995 |
| EP | 0 899 779 A2 | 3/1999 |
| EP | 0 899 779 A3 | 3/1999 |
| JP | 8 264 530 A2 | 10/1996 |
| KR | 2001-88044 | 12/2001 |
| KR | 2002-31160 | 6/2002 |
| KR | 2002-87192 | 12/2002 |
| KR | 2003-5727 | 1/2003 |
| KR | 2003-14115 | 3/2003 |
| KR | 2003-14117 | 3/2003 |
| KR | 2003-33234 | 5/2003 |
| KR | 2003-40758 | 6/2003 |
| WO | WO 96/17107 | 6/1996 |
| WO | WO 00/01006 | 1/2000 |
| WO | WO 00/63957 | 10/2000 |
| WO | WO 03/102265 | 12/2003 |
| WO | WO 2006/093260 | 9/2006 |

OTHER PUBLICATIONS

Hiltunen et al., "Nitrides of titanium, niobium, tantaluma and molybdenum grown as thin films by the atomic layer epitaxy method," Thin Solid Films, 166:149-154 (1988).

Jeon, H., et al., "A Study on the Characteristics of TiN Film Deposited by Atomic Layer Chemical Vapor Deposition Method," J. Vac. Sci. Technol. A, 18(4), 1595-1598 (2000).

Klaus, J.W., et al., "Atomically controlled growth of tungsten and tungsten nitride using sequential surface reactions," Appl. Surf. Science 162-163; 479-471 (2000).

Klaus, J.W., et al., "Atomic layer deposition of tungsten nitride films using sequential surface reactions," Journal of the Electrochemical Soc., 147(3):1175-1181 (2000).

Klaus, J.W., et al., "Atomic layer deposition of tungsten using sequential surface chemistry with a sacrificial stripping reaction," Thin Solid Films, 360:145-153 (2000).

Klaus, J.W., et al., "Atomic layer deposition of tungsten and tungsten nitride using sequential surface reactions," : AVS 46$^{th}$ International Symposium, Seattle, WA, abstract TF-TuM6 (1999).

Ritala et al., "Atomic layer epitaxy growth of TiN thin films," J. Electrochem. Soc. 142:8):2731-2737 (1995).

U.S. Appl. No. 11/627,749, filed Jan. 26, 2007, titled "Plasma-Enhanced ALD of Tantalum Nitride Films", listing as inventor Kai-Erik Elers.

Office Action mailed Nov. 13, 2007, U.S. Appl. No. 11/627,749.

European Search Report dated May 5, 2008, Application No. 08 000 724.8.

U.S. Appl. No. 11/627,749, filed Jan. 26, 2007; Office Actions mailed May 2, 2007, Nov. 13, 2007, Aug. 1, 2008 and Feb. 23, 2009.

Park et al., Plasma-enhanced atomic layer deposition of Ta-N. thin films, Journal of the Electrochemical Society, Electrochemical Society, Jan. 2002, vol. 149, Issue 1, pp. C28-C32, Manchester, New Hampshire.

* cited by examiner

PASSIVATED STOICHIOMETRIC METAL NITRIDE FILMS

REFERENCE TO RELATED APPLICATIONS

The present application is related to U.S. patent application Ser. No. 10/110,730 to Elers et al., filed Apr. 11, 2002, now U.S. Pat. No. 6,863,727, which is incorporated herein by reference.

BACKGROUND OF THE INVENTION

1. Field of the Invention

The present invention relates to deposition of metal nitride thin films. In particular, the invention concerns methods of growing metal nitride thin films by Atomic Layer Deposition ("ALD").

2. Description of the Related Art

Integrated circuits contain interconnects, which are usually made of aluminum (Al) or copper (Cu). Cu is particularly prone to diffusion or electromigration into surrounding materials, which may adversely affect the electrical properties of the IC and cause active components to malfunction. Diffusion of metals from interconnects into active parts of the device can be prevented with an electrically conductive diffusion barrier layer. Preferred diffusion barriers are, e.g., amorphous and stoichiometric transition metal nitrides, such as TiN, TaN and WN. The nitrides can also be non-stoichiometric if nitrogen occupies lattice interstitial sites. In addition to barrier applications, metal nitride films are also used in metal gates (mid gap films) and MIM/MIS capacitors as bottom and/or top electrodes.

For certain semiconductor device applications, stoichiometric (i.e., metal-to-nitrogen ratio equal to one) metal nitride films are preferred over non-stoichiometric metal nitride films. A stoichiometric metal nitride films has a higher electrical conductivity (lower electrical resistivity) than a non-stoichiometric metal nitride film, making it ideal for use as a diffusion barrier. However, stoichiometric metal nitride films have been found difficult to form by atomic layer deposition (ALD).

ALD, sometimes called atomic layer epitaxy (ALE), is a self-limiting process, whereby alternating and sequential pulses of reaction precursors are provided to deposit no more than one monolayer of material per deposition cycle. The deposition conditions and precursors are selected to ensure self-saturating reactions, such that an adsorbed layer in one pulse leaves a surface termination that is non-reactive with the additional gas phase reactants of the same pulse. A subsequent pulse of different reactants reacts with the previous termination to produce the desired material and enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

In a typical ALD process, one deposition cycle comprises exposing the substrate to a first reactant, such as a metal precursor, removing unreacted first reactant and reaction by-products, if any, from the reaction chamber, exposing the substrate to a second reactant, followed by a second removal step. Typically, halide reactants, such as $TiCl_4$ and $HfCl_4$, are used as metal precursors in ALD deposition because those reactants are inexpensive and relatively stable, but at the same time reactive towards different types of surface groups. Where formation of metal nitride thin films is desired, ammonia ($NH_3$) is typically used as a second precursor, though other nitrogen-containing compounds may also be used.

Surplus chemicals and reaction by-products, if any, are removed from the reaction chamber before the next reactive chemical pulse is introduced into the chamber. The separation of reactants by inert gas prevents gas-phase reactions between reactants and enables self-saturating surface reactions. As a result, ALD growth generally does not require strict temperature control of the substrate or precise dosage control of the reactants. Undesired gaseous molecules can be effectively expelled from the reaction chamber by maintaining a substantially high gas flow rate of a purge gas. The purge gas directs the unreacted molecules toward the vacuum pump used for maintaining a suitable pressure in the reaction chamber. ALD advantageously provides accurate control of the composition, thickness and uniformity for thin films.

Methods of forming metal nitride layers by ALD are know in the art. For example, U.S. Pat. No. 6,863,727 to Elers et al., issued Mar. 8, 2005, the entire disclosure of which is incorporated herein by reference, teaches a "3-step" ALD method of forming a metal nitride film comprising alternately and sequentially contacting a substrate with a vapor-phase pulse of a metal source chemical, a boron-containing reducing agent and a nitrogen source chemical. However, metal nitride films formed via the 3-step method have a tendency to yield non-stoichiometric metal nitride films. Alternative methods, which employ enhanced reducing agents, have faced similar problems.

Additionally, metal nitride films are reactive towards oxygen and other oxidizing agents. This is problematic because metal nitride films formed according to methods available in the art may oxidize prior to processing steps that follow formation of the films, for example during transport to another processing chamber. Oxidized metal nitride films are undesirable because they impede contact between the metal nitride film and overlying layers in typical semiconductor device structures. If the oxide layers are substantially thick, the electrical properties of the metal nitride films may be adversely affected.

Accordingly, there is a need in the art for ALD methods of forming stoichiometric and passivated metal nitride films, wherein the surfaces of the films are resistant to oxidation.

SUMMARY OF THE INVENTION

According to one aspect of the invention, processes for forming a passivated metal nitride thin film on a substrate in a reaction space comprise forming a metal nitride thin film through an ALD process comprising the steps of a) contacting the substrate with a vapor-phase pulse of a metal source chemical; b) removing excess metal source chemical and reaction by-products, if any, from the reaction space; c) contacting the substrate with a vapor phase pulse of one or more plasma-excited species of hydrogen; d) removing excess plasma-excited species of hydrogen and reaction by-products, if any, from the reaction space; e) contacting the substrate with a vapor phase pulse of a nitrogen source chemical; f) removing excess nitrogen source chemical and reaction by-products, if any, from the reaction space; and g) repeating steps a) through f) until a metal nitride thin film of desired thickness is formed over the substrate. The metal nitride thin film is preferably passivated by contacting the substrate with a vapor phase pulse of a source chemical of a passivating species.

According to another aspect of the invention, processes for forming a passivated metal nitride film on a substrate in a reaction space comprise forming a metal nitride film through an ALD process comprising the sequential steps of a) contacting the substrate with a vapor-phase pulse of a metal source chemical; b) contacting the substrate with a vapor phase pulse of one of a reducing agent and a nitrogen source chemical; c) contacting the substrate with a vapor phase pulse of the other of the reducing agent and the nitrogen source chemical; and d) repeating steps a) through c) until a metal nitride film of predetermined thickness is formed over the substrate. The metal nitride film is preferably passivated by contacting the substrate with a vapor phase pulse of a source chemical of a passivating species.

According to yet another aspect of the invention, methods for forming a passivated stoichiometric metal nitride thin film on a substrate comprise depositing a stoichiometric metal nitride film over a substrate in a reaction space. The stoichiometric metal nitride film is exposed to a vapor phase source chemical comprising a passivating species.

According to still another aspect of the invention, structures comprising a passivated stoichiometric metal nitride film formed over a substrate comprise a bottom layer disposed over the substrate, the bottom layer comprising one or more metal species and nitrogen, the bottom layer being defined by a stoichiometric ratio between the one or more metal species and nitrogen, the stoichiometric ratio preferably being approximately equal to one. The passivated metal nitride film further includes a top layer comprising the metal species, nitrogen and a passivating species, wherein the passivating species includes one or more elements having six electrons in their outer electronic shells. In particular embodiments, the passivating species are elements selected from Group VI of the periodic table of the elements ("periodic table"), preferably selected from the group consisting of sulfur (S), selenium (Se) and tellurium (Te).

All of these embodiments are within the scope of the invention herein disclosed. These and other aspects of embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The invention will be better understood from the Detailed Description and from the appended drawings, which are meant to illustrate and not to limit the invention, and wherein.

DETAILED DESCRIPTION

Figure 1:
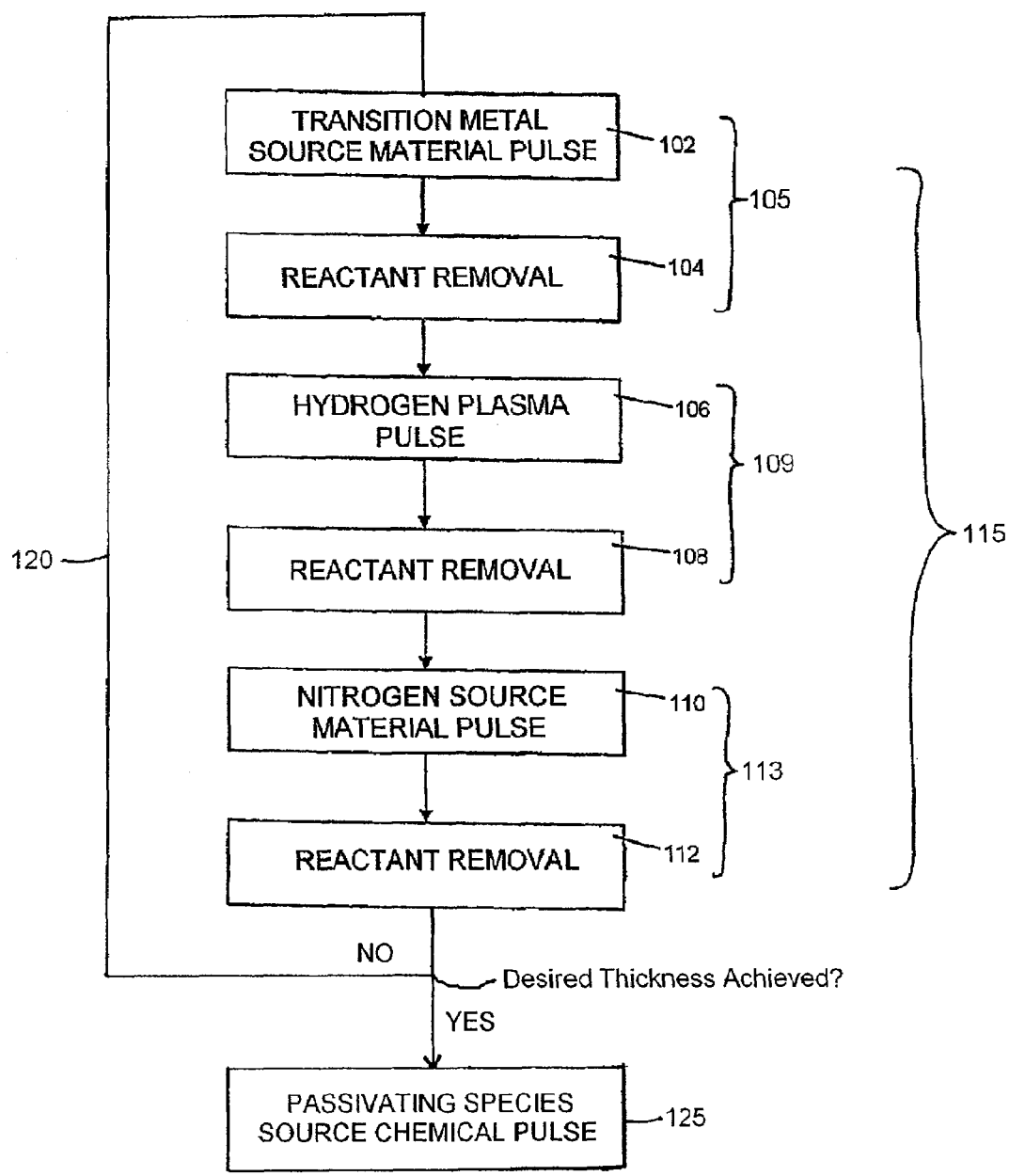
FIG. 1 is a block diagram of a pulsing sequence of an ALD process, according to a preferred embodiment of the invention.

The present invention provides methods for the formation of passivated metal nitride thin films, preferably passivated stoichiometric metal nitride thin films over substrates, as well as related structures. By contacting a substrate in a reaction space with alternating and sequential vapor phase pulses of a metal source chemical, a hydrogen plasma and a nitrogen source chemical, a stoichiometric metal nitride film can be formed on the substrate. Contacting an exposed top surface of the stoichiometric metal nitride film with a source chemical comprising a passivating species forms a passivation layer over the metal nitride film, thereby protecting the film from reaction with oxidizing agents such as, e.g., oxygen ($O_2$), or air. Preferred passivating species have six electrons in their outer electronic shells and preferably include Group VI elements of the periodic table, more preferably selected from the group consisting of sulfur (S), selenium (Se) and tellurium (Te).

Definitions

In context of the present invention, an "ALD process" or an "ALD type process" generally refers to a process for producing thin films over a substrate molecular layer by molecular layer using self-saturating chemical reactions. The general principles of ALD are disclosed, e.g., in U.S. Pat. Nos. 4,058,430 and 5,711,811, the disclosures of which are incorporated herein by reference. In an ALD process, gaseous reactants, i.e., "precursors" or, in some contexts, "source chemicals," are conducted into a reaction chamber of an ALD reactor where they contact a substrate located in the chamber to provide a self-limiting surface reaction. The pressure and the temperature of the reaction chamber are adjusted to a range where physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, in part, on the number of available reactive surface sites and the bulkiness of the reactants. Gas phase reactions between precursors and any undesired reactions with by-products are inhibited by separating precursor pulses from each other in time and by removing excess reactants and by-products, if any, between reactant pulses. The reaction chamber may be purged with an inactive gas (e.g., nitrogen or argon) and/or evacuated using, e.g., a pump between precursor pulses to remove surplus gaseous reactants and reaction by-products from the chamber.

ALD-type processes include, without limitation, thermal ALD processes and plasma enhanced ALD (PEALD) processes, wherein plasma-excited species of a source chemical (or material) are used during certain processing steps. In some cases, an ALD-type process may include both thermal and PEALD processes.

"Reaction space" is used to designate a volume in a reactor in which conditions can be adjusted to effect thin film growth by ALD or ALD type processes. Typically, the reaction space includes surfaces subject to all reaction gas pulses from which gases or particles can flow to the substrate by entrained flow or diffusion during normal operation. The reaction space can be, for example, in a single-wafer reactor or a batch reactor, where deposition on multiple substrates takes place at the same time.

"Adsorption" is used to designate a chemical attachment of atoms or molecules on a surface. Adsorption may include forming a chemical bond to the surface (i.e., chemisorption) or forming a weakly-bound condensed phase on the surface (i.e., physisorption).

"Substrate" is used to designate any workpiece on which deposition is desired. Typically, the substrate is one that is desirable for use in forming integrated circuits (ICs). Typical substrates include, without limitation, silicon, silica, coated silicon, copper metal and nitride.

"Surface" is used to designate a boundary between the reaction space and a feature of the substrate.

"Thin film" means a film that is grown from elements or compounds that are transported as separate ions, atoms, or molecules via vacuum, gaseous phase or liquid phase from a source to a substrate. The thickness of the film depends upon the application and may vary in a wide range, preferably from one atomic layer to 1,000 nanometers (nm) or more. In some embodiments, the thin film is less than about 20 nm in thickness, preferably less than about 10 nm and more preferably less than about 5 nm.

"Metal nitride thin film" designates a thin film that comprises a metal species and nitrogen. "Metal species" in the context of the present invention includes a metal or a plurality of metals. As an example, a metal species may be tantalum or a tantalum-tungsten alloy.

Metal nitride films may be "stoichiometric" (or "substantially stoichiometric"), wherein the stoichiometric ratio between the metal or plurality of metals and nitrogen is approximately equal to one, or "non-stoichiometric", wherein the ratio is not equal to one. As an example, a stoichiometric tantalum nitride film may be defined by TaN and a non-stoichiometric tantalum nitride film may be defined by $Ta_3N_5$. A thin film that is "substantially stoichiometric" is one in which most of the metal nitride in the thin film is in stoichiometric form.

A "passivated film" refers to a thin film that has been treated or coated in order to reduce the chemical reactivity of its exposed top surface. Preferably, once a film or thin film has been passivated, it is not reactive to an oxidizing species, such as, e.g., oxygen.

A "passivating species" is any species that, upon incorporation into (or on top of) the surface of a film or thin film, protects the surface from oxidation. A passivating species is preferably a Group VI element of the periodic table, more preferably an element selected from the group consisting of sulfur (S), selenium (Se) and tellurium (Te). The passivating species may degrade the electronic properties (i.e., conductivity) of the thin film which it is incorporated into, though degradation is less than what it would be in the presence of oxygen.

"Plasma-excited species" is used to designate one or more excited species of a vapor phase precursor formed within a reaction space (i.e., in situ) or externally in a remote plasma generator. Plasma-excited species include radicals, cations and anions of the precursor and derivatives formed during plasma generation, such as, e.g., cracking fragments. For example, plasma-excited species of ammonia ($NH_3$) may include ammonia radical ($NH_2^*$) and ammonia cation ($NH_3^+$). It will be appreciated that other precursors may include different plasma-excited species.

Formation of Stoichiometric and Passivated Metal Nitride Films

The methods presented herein enable controlled and conformal deposition of passivated stoichiometric metal nitride thin films on substrate surfaces. Thin films formed according to preferred methods have substantially uniform thicknesses. In preferred embodiments, thin films are deposited from halogen-containing metal source chemicals (or materials). Geometrically challenging applications are also possible due to the self-limiting nature of surface reactions.

According to preferred embodiments, atomic layer deposition (ALD) processes are used to form metal nitride thin films on a substrate, such as an integrated circuit workpiece. A substrate or workpiece placed in a reaction space is subjected to alternating and sequential vapor phase pulses of a metal source chemical, hydrogen plasma and a nitrogen source chemical. In particular, metal nitride thin films are formed by repetition of a self-limiting deposition cycle. In preferred embodiments, after the last deposition cycle, a passivation layer is formed on the stoichiometric metal nitride film.

Preferably, the ALD reaction uses at least three distinct deposition reactants and a fourth passivation reactant. A first reactant (or source chemical) will form no more than about one atomic monolayer ("monolayer") on the substrate surface and includes a metal ("metal") species, preferably a transition metal desired in the layer being deposited. In preferred embodiments, the metal nitride film to be formed comprises a transition metal or a plurality of transition metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and combinations thereof. The metal source chemical, also referred to herein as the "metal reactant," is preferably a halide. For some embodiments, the metal source material is selected from the group consisting of metal bromides, metal chlorides, metal fluorides and metal iodides. In some embodiments, the metal nitride film comprises tantalum and the metal source chemical used to deposit the film is selected from the group consisting of $TaBr_w$, $TaCl_x$, $TaF_y$ and $TaI_z$, where w, x, y, and z are integers, preferably from 1 to 6.

A second reactant is preferably a reducing agent. In preferred embodiments, the second reactant is a hydrogen plasma and thus includes plasma-excited species of hydrogen, such as, e.g., hydrogen radicals (H*) and/or hydrogen ions ($H^+$, $H_2^+$). Plasma-excited species of hydrogen may be generated by a plasma generator either in the reaction space (i.e., in situ) or remotely. As an example, plasma-excited species of hydrogen may be generated in the reaction space using a showerhead-type PEALD reactor disclosed in U.S. patent application No. 2004/0231799. As another example, the hydrogen plasma may be generated externally with respect to the reaction space, such as in a remote plasma generator.

A third reactant is preferably a nitrogen source material or chemical. The third reactant is typically not a halide, although in some embodiments it may be. In preferred embodiments, the third reactant is selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride ($NF_3$), hydroxylamine ($NH_2OH$) and salts thereof, tert-butylamine ($NH_2C(CH_3)_3$) and salts thereof, allylamine ($NH_2CH_2CHCH_2$) and salts thereof, tertbutylamidi, ammonium fluoride, ammonium chloride, $CH_3N_3$, hydrazine hydrochloride dimethyl hydrazine, hydroxylamine hydrochloride, methylamine, diethylamine, triethylamine and combinations thereof. In a particular embodiment, it is ammonia ($NH_3$). In other embodiments, the third reactant comprises plasma-excited species of a nitrogen-containing chemical generated in the reaction space (i.e., in situ) or remotely. In some embodiments, the third reactant includes plasma-excited species of ammonia ($NH_3$). In other embodiments, the third reactant includes plasma-excited species of nitrogen ($N_2$) and hydrogen ($H_2$).

A fourth reactant is preferably a source chemical comprising a passivating species. In preferred embodiments, exposure of the metal nitride film to the fourth reactant deposits the passivating species on an exposed top surface of the metal nitride film or incorporates the passivating species into the top metal nitride layer, thus forming a passivation layer. The passivating species preferably have six electrons in their outer electronic shells. In some embodiments, passivating species include Group VI elements of the periodic table, and may include one or more elements selected from the group consisting of sulfur (S), selenium (Se) and tellurium (Te). If the passivating species desired in and/or on the top layer of the metal nitride film is sulfur, the source chemical of the passivating species may comprise hydrogen sulfide ($H_2S$). Exposure of the metal nitride film to the source chemical of the passivating species at least partially passivates the metal nitride film. In preferred embodiments, exposure of the metal nitride film to the passivating species source chemical substantially passivates the metal nitride film, thus eliminating all active sites capable of reacting with oxygen. In some embodiments, the passivating species includes plasma-excited species of one or more Group VI elements formed either in the reaction space (i.e., in situ) or remotely. In some embodiments, the passivating layer may have a thickness of one monolayer (ML). In other embodiments, the passivating layer may have a thickness greater than 1 ML if, upon deposition, passivating species migrate to layers below the top layer of the metal nitride film. Preferably, the passivating layer has a thickness of at least one monolayer (ML) to prevent oxidation of the metal nitride layer.

In one phase of the ALD cycle ("metal phase" or "first phase"), the first reactant, which preferably comprises a metal species (i.e., metal source material), is supplied to the reaction chamber and chemisorbs on the substrate surface. The reactant supplied in this phase is selected such that, under preferred conditions, the amount of reactant that can be bound to the surface is determined by the number of available binding sites and by the physical size of the chemisorbed species (including ligands). The chemisorbed layer left by a pulse of the metal reactant is self-terminated with a surface that is non-reactive with the remaining chemistry of that pulse. This phenomenon is referred to herein as "self-saturation." In some embodiments, more than one metal source gas can be supplied simultaneously such that the layer comprises more than one metal nitride. In other embodiments, a single reactant comprising two or more different metal species may be supplied.

Maximum step coverage on the workpiece surface is obtained when no more than about a single molecular layer of metal source material molecules is chemisorbed in each self-limiting pulse. Due to the size of the chemisorbed species and the number of reactive sites, somewhat less than a monolayer (ML) may be deposited in each pulse of metal reactant.

Excess first reactant and reaction by-products, if any, are removed from the reaction space with the aid of a purge gas and/or by evacuation. Purge gas includes, without limitation, argon (Ar), helium (He) and hydrogen ($H_2$).

In a "second phase" or "reduction phase" of the ALD cycle, a second reactant, which is preferably a reducing agent, is provided in the reaction space. In preferred embodiments, the second reactant is capable of donating electrons to the transition metal (or plurality of transition metals) defining the deposited metal film, thereby decreasing the oxidation state of the transition metal. In preferred embodiments, the second reactant is a hydrogen plasma, which includes plasma-excited species of hydrogen. In preferred embodiments, the first reactant is a transition metal halide and the plasma-excited species of hydrogen remove halide atoms (residues) from a metal film adsorbed in the first phase, thus donating electrons to the film and forming a reduced metal film. As an example, if a tantalum-containing film is formed in the first phase, exposure of the film to plasma-excited species of hydrogen may reduce the tantalum film from an oxidation state of +5 to 0.

Excess second reactant and reaction by-products, if any, are removed from the reaction space with the aid of a purge gas and/or evacuation.

In a "third phase" of the cycle, also referred to herein as a "nitrogen-contributing phase", a third reactant is provided. The third reactant, which is preferably a nitrogen source chemical (such as $NH_3$), reacts with the reduced metal film left on the substrate surface in the preceding phase to form a metal nitride film.

Excess third reactant and reaction by-products, if any, are removed from the reaction space with the aid of a purge gas and/or evacuation.

In preferred embodiments, the first phase, second phase and third phase are repeated until a stoichiometric metal nitride film of desired (or predetermined) thickness is achieved. In some embodiments, the first phase and second phase are repeated a predetermined number of times prior to the third phase to form a metal nitride thin film of predetermined thickness.

While refereed to as the first phase, second phase and third phase, it will be appreciated that these designations do not necessarily specify the order in which the phases are performed. The order in which the first phase, second phase and third phase is performed, and the number of times each phase (or combination of phases) is (are) performed, may be selected as desired. For example, in some embodiments, the third phase precedes the second phase such that the next pulse after removal of the metal source material and reaction by-products, if any, is that of a nitrogen source chemical. In such a case, the first phase and third phase may be repeated a predetermined number of times prior to the second phase. In other embodiments, the second phase precedes the first phase, and the first phase is followed by the third phase. In other embodiments, the second phase is performed after every other phase. In such a case, the order of phases may be, e.g., first phase/second phase/third phase/second phase/first phase/second phase/third phase/second phase.

In a "fourth phase" of the cycle, also referred to herein as a "passivation phase", the metal nitride film formed in the first three phases is passivated by exposing the film to a fourth reactant, which is preferably a source chemical of a passivating species. The source chemical of the passivating species reacts with the surface of the film, thereby forming a layer of the passivating layer. In preferred embodiments, the passivating layer defines a top layer of the passivated metal nitride film and is, at most, one monolayer thick. In other embodiments, the passivating layer is several monolayers thick. The passivating layer may be between about 1 monolayer (ML) and 20 ML thick. The layer of the passivating species is preferably less reactive to oxygen and other oxidizing agents than the underlying metal nitride thin film.

Excess fourth reactant and reaction by-products, if any, are removed from the reaction space with the aid of a purge gas and/or evacuation.

Provision of a particular reactant is generally considered to follow provision of another reactant if a purge or other reactant removal step intervenes.

In an exemplarily embodiment, an ALD process comprises:

1. providing a transition metal halide to the reaction space;
2. purging and/or evacuating excess transition metal halide and reaction by-products from the reaction space;
3. providing plasma-excited species of hydrogen to the reaction space;
4. purging and/or evacuating excess plasma-excited species of hydrogen and reaction by-products from the reaction space;

5. providing a nitrogen source chemical to the reaction space;

6. purging and/or evacuating excess nitrogen source chemical and reaction by-products from the reaction space;

7. repeating steps 1-6 until a stoichiometric metal nitride of desired thickness is formed; and 8. passivating the stoichiometric metal nitride layer.

In some embodiments, the step of providing plasma-excited species of hydrogen (step 3 above) includes introducing hydrogen gas into the reaction space and generating hydrogen plasma in situ. This step may include providing power to an RF electrode to generate the plasma. After a desired exposure time, plasma production is terminated and reaction by-products (if any) are removed using a purge and/or evacuation step (step 4). In other embodiments, plasma-excited species of hydrogen are generated in a separate reactor (i.e. remotely) in communication with the reaction space and subsequently directed to the reaction space.

In some embodiments, steps 1-4 can be repeated several times before steps 5 and 6 are performed, thus forming a reduced metal film with thickness greater than one monolayer. The skilled artisan will recognize, however, that the thickness of the metal film will be chosen such that exposure of the film to a nitrogen source material will produce a metal nitride layer with compositional uniformity throughout the film. Preferably, steps 1-4 can be repeated as desired so long as the thickness of the deposited film is less than or equal to about 30 Å, more preferably less than or equal to about 20 Å.

With reference to FIG. 1, in an exemplary embodiment of the invention, after initial surface termination, if necessary, a first reactant or source material is supplied 102 to the substrate. In accordance with a preferred embodiment, the first reactant pulse comprises a volatile halide that is reactive with the workpiece surfaces of interest. The halide comprises a metal species that is to form part of the deposited layer and is preferably pulsed into the reaction space with the aid of a carrier gas. The halogen-containing species adsorbs upon the workpiece surfaces in a self-limiting manner. In a preferred embodiment, the first reactant is a transition metal source material, such as a metal halide, and the thin film being formed comprises a stoichiometric metal nitride. The first reactant pulse self-saturates the workpiece surfaces such that any excess constituents of the first reactant pulse do not further react with the monolayer formed by this process. Self-saturation is due, at least in part, to halide tails terminating the monolayer, protecting the layer from further reaction.

The first reactant is then removed 104 from the reaction space. Preferably, step 104 merely entails stopping the flow of the first reactant or chemistry while continuing to flow a carrier gas (preferably an inert gas, e.g., Ar or $H_2$) for a sufficient time to purge excess reactants and reactant by-products from the reaction space. Preferably, the removal 104 comprises continuing to flow purge gas for between about 0.1 seconds and 20 seconds after stopping the flow of the first reactant pulse. Inter-pulse purging is described in U.S. Pat. No. 6,511,539, entitled, "APPARATUS AND METHOD FOR GROWTH OF A THIN FILM," the disclosure of which is incorporated herein by reference. In other arrangements, the chamber may be pumped down between alternating chemistries. See, for example, PCT publication number WO 96/17107, published Jun. 6, 1996, entitled, "METHOD AND APPARATUS FOR GROWING THIN FILMS," the disclosure of which is incorporated herein by reference. In other embodiments, the removal 104 comprises pumping the reaction space. In still other embodiments, the removal 104 comprises both purging and pumping the reaction space. Together, the adsorption 102 and reactant removal 104 represent a first phase 105 in an ALD cycle. The first phase in the illustrated ALD cycle is thus the metal phase.

With continued reference to FIG. 1, a second reactant is pulsed 106 to (or contacted with) the workpiece. The second reactant preferably reduces the monolayer left by the first reactant. In a preferred embodiment, the second reactant includes plasma-excited species of hydrogen (e.g., hydrogen radicals) and the second reactant pulse 106 comprises generating plasma-excited species of hydrogen in the reactor or remotely. The plasma-excited species of hydrogen reduces the oxidation state of the metal (or plurality of metals) in the film formed in the first phase.

After a time period sufficient to reduce the monolayer (or nitride layer of multiple cycles prior to reduction), plasma generation is terminated and reaction by-products, if any, are removed 108 from the reaction space, preferably with the aid of a purge gas. The removal can be as described for step 104. Together, steps 106 and 108 represent a second (or reduction) phase 109 of the illustrated PEALD process.

Next, a third reactant or source material pulse is supplied 110 to the workpiece. The third reactant or chemistry is a nitrogen source chemical, that reacts with the surface left by the first and second reactants. In a preferred embodiment, the nitrogen source chemical is supplied to the workpiece with the aid of a carrier gas. Preferably, the third reactant pulse leaves no more than about a monolayer of a stoichiometric metal nitride film. The third reactant pulse 110 is also preferably self-saturating.

After a time period sufficient to completely saturate and react the monolayer with the third reactant 110, excess third reactant and reaction by-products, if any, are removed 112 from the workpiece. As with the removal 104 of the first reactant, this step 112 preferably comprises stopping the flow of the third reactant and continuing to flow carrier gas for a time period sufficient for excess reactants and volatile reaction by-products from the third reactant pulse to be purged from the reaction space. Together, the third reactant pulse 110 and removal 112 represent a third (or nitrogen-contributing) phase 113 in the illustrated process.

The first phase, second phase and third phase may be repeated 120 as desired until a stoichiometric metal nitride film of desired thickness is achieved. Together, the first phase, second phase and third phase represent a metal nitride phase 115. Preferably, the metal nitride phase 115 produces a stoichiometric metal nitride thin film over the substrate.

Next, the stoichiometric metal nitride thin film is exposed to a fourth reactant 125, which is preferably a source chemical of a passivating species, for a time period sufficient to passivate the metal nitride film. The source chemical of the passivating species reacts with the surface of the film, thereby forming a passivation layer in the metal nitride film.

Although preferred embodiments have been described in the context of ALD and PEALD, it will be appreciated that passivated stoichiometric metal nitride films can be formed by chemical vapor deposition (CVD). Rather than pulsing one reactant (or source chemical) into a reaction space at a time, a plurality of reactants may be pulsed simultaneously, thus permitting growth of metal nitride thin films of several monolayer thickness. For example, in a first phase, a metal source chemical and nitrogen source chemical may be simultaneously pulsed into a reaction space, and, in a second phase, a plasma-excited species of hydrogen may be pulsed into the reaction space to form a metal nitride thin film. The first phase and second phase may be repeated as desired to form a metal nitride thin film of predetermined thickness. The metal nitride thin film may subsequently be passivated with a pulse of a source chemical of a passivating species. The CVD sequence may be suited for cases in which thin films formed on respective substrate (or wafer) surfaces are not self-limiting.

Figure 2:
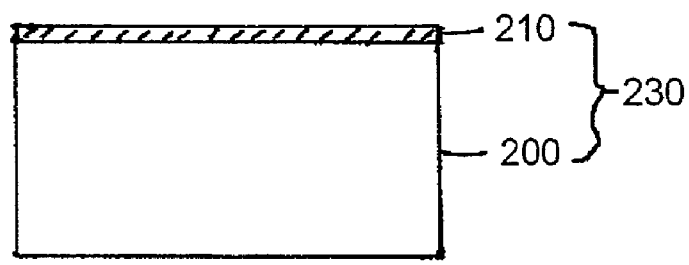
FIG. 2 is a schematic, cross-sectional side-view of a passivated metal nitride film that can be formed by methods disclosed herein.

With reference to FIG. 2, a passivated metal nitride film 230 formed according to methods of preferred embodiments comprises a stoichiometric metal nitride layer 200 overlying a substrate (not shown) and a passivation layer 210 over the metal nitride layer 200. In some embodiments, the substrate is a semiconductor device. The substrate may comprise material selected from the group consisting of silicon, silica, coated silicon, copper metal, dielectric materials and combinations thereof. The layers shown in FIG. 2 are not necessarily drawn to scale. The passivation layer 210 is formed upon adsorption and incorporation of a passivating species (e.g., S) into sites on the exposed top surface of the metal nitride film. Upon saturation, the passivation layer would have a thickness of at most one monolayer. Given sufficient energy, however, the passivating species may migrate to sites below the top surface of the metal nitride film. In such a case, the passivating species can be said to occupy subsurface sites in the metal nitride film and thus have a thickness greater than one monolayer.

The stoichiometric metal nitride layer 200 preferably has a thickness between about 1 nanometers (nm) and 50 nm, more preferably between about 2 nm and 20 and still more preferably between about 2 nm and 10 nm. The passivation layer preferably has a thickness between about 2 Å and 20 Å, more preferably between about 2 Å and 10 Å, still more preferably between about 2 Å and 6 Å.

With continued reference to FIG. 2, the metal species in the stoichiometric metal nitride layer 200 has a first oxidation state and the metal species in the passivation layer 210 has a second oxidation state. In preferred embodiments, the first oxidation state is lower than the second oxidation state. As an example, the first oxidation state may be +3 and the second oxidation state may be +5 or higher.

Thus, a stoichiometric and passivated metal nitride film has been formed. The films formed according to preferred methods may define, e.g., diffusion barriers in damascene or dual damascene structures in integrated circuits, metal gates in transistors, or metal electrodes in capacitor structures. In some embodiments the metal nitride films may serve as top/bottom electrodes for MIM/MIS capacitors, such as eDRAM, DRAM, RF decoupling, planar and 3-D capacitors. Generally, a passivated metal nitride film is useful when the oxidation of a metal is of concern.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A process for forming a passivated metal nitride thin film on a substrate in a reaction space, comprising:
    forming a metal nitride thin film through an ALD process comprising the steps of:
        a) contacting the substrate with a vapor-phase pulse of a metal source chemical;
        b) removing excess metal source chemical from the reaction space;
        c) contacting the substrate with a vapor phase pulse of one or more plasma-excited species of hydrogen;
        d) removing excess plasma-excited species of hydrogen and reaction by-products from the reaction space;
        e) contacting the substrate with a vapor phase pulse of a nitrogen source chemical;
        f) removing excess nitrogen source chemical and reaction by-products from the reaction space; and
        g) repeating steps a) through f) until a metal nitride thin film of desired thickness is formed over the substrate; and
    passivating the metal nitride thin film by contacting the substrate with a vapor phase pulse of a source chemical of a passivating species.

2. The process of claim 1, wherein the metal nitride thin film is stoichiometric.

3. The process of claim 1, wherein steps a)-e) are repeated a predetermined number of times prior to steps e) and f).

4. The process of claim 1, wherein contacting comprises pulsing with the aid of a carrier gas.

5. The process of claim 1, wherein the metal source chemical comprises at least one metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru) and osmium (Os).

6. The process of claim 1, wherein the metal source chemical is selected from the group consisting of metal halides and metal organic compounds.

7. The process of claim 6, wherein the metal source chemical is selected from the group consisting of metal bromides, metal chlorides, metal fluorides and metal iodides.

8. The process of claim 7, wherein the metal source chemical is a tantalum compound selected from the group consisting $TaBr_w$, $TaCl_x$, $TaF_y$, and $TaI_z$, where 'w', 'x', 'y' and 'z' are integers from 1 to 6.

9. The process of claim 1, wherein the one or more plasma-excited species of hydrogen are generated remotely.

10. The process of claim 1, wherein the one or more plasma-excited species of hydrogen are generated in the reaction space.

11. The process of claim 1, wherein the nitrogen source chemical is selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride ($NF_3$), hydroxyl amine ($NH_2OH$) and salts thereof, tert-butylamine ($NH_2C(CH_3)_3$) and salts thereof, allylamine ($NH_2CH_2CHCH_2$) and salts thereof, tertbutylamidi, ammonium fluoride, ammonium chloride, $CH_3N_3$, hydrazine hydrochloride dimethyl hydrazine, hydroxylamine hydrochloride, methylamine, diethylamine, triethylamine and combinations thereof.

12. The process of claim 1, wherein the nitrogen source chemical includes one or more plasma-excited species of a nitrogen-containing chemical.

13. The process of claim 12, wherein the nitrogen-containing chemical includes ammonia ($NH_3$).

14. The process of claim 1, wherein the nitrogen source chemical includes plasma-excited species of $N_2$ and $H_2$.

15. The process of claim 1, wherein contacting the substrate with the vapor phase pulse of the source chemical of the passivating species at least partially passivates a top surface of the metal nitride thin film.

16. The process of claim 1, wherein the passivating species includes one or more elements from Group VI of the periodic table.

17. The process of claim 16, wherein the passivating species includes one or more elements selected from the group consisting of sulfur (S), selenium (Se) and tellurium (Te).

18. The process of claim 1, wherein contacting the substrate with the vapor phase pulse of the source chemical of the passivating species comprises generating one or more plasma-excited species of the source chemical of the passivating species.

19. The process of claim 1, wherein the reaction space is located within a plasma-enhanced atomic layer deposition (PEALD) reactor.

20. The process of claim 1, wherein removing comprises purging with the aid of a purge gas.

21. The process of claim 20, wherein the purge gas is selected from the group consisting of hydrogen ($H_2$), helium (He) and argon (Ar).

22. The process of claim 1, wherein removing comprises applying a vacuum via a pumping system.

23. A process for forming a passivated metal nitride film on a substrate in a reaction space, comprising:
    forming a metal nitride thin film through an ALD process comprising the sequential steps of:
    a) contacting the substrate with a vapor-phase pulse of a metal source chemical;
    b) contacting the substrate with a vapor phase pulse of one of a reducing agent and a nitrogen source chemical;
    c) contacting the substrate with a vapor phase pulse of the other of the reducing agent and the nitrogen source chemical; and
    d) repeating steps a) through c) until a metal nitride film of predetermined thickness is formed over the substrate; and
    passivating the metal nitride film by contacting the substrate with a vapor phase pulse of a source chemical of a passivating species.

24. The process of claim 23, further comprising removing the metal source chemical, reducing agent, or nitrogen source chemical, and any reaction by-products, after each of said vapor phase pulses.

25. The process of claim 23, wherein the reducing agent comprise one or more plasma-excited species of hydrogen.

26. The process of claim 23, wherein the metal source chemical comprises material selected from the group consisting of $TaBr_w$, $TaCl_x$, $TaF_y$ and $TaI_z$, where w, x, y, and z are integers, preferably from 1 to 6.

27. The process of claim 23, wherein the nitrogen source chemical includes ammonia ($NH_3$).

28. The process of claim 23, wherein the metal nitride thin film is substantially stoichiometric.

29. A method of forming a passivated stoichiometric metal nitride thin film on a substrate, comprising:
    depositing a stoichiometric metal nitride thin film over a substrate in a reaction space; and
    exposing the stoichiometric metal nitride film to a vapor phase source chemical comprising a passivating species.

30. The method of claim 29, wherein the passivating species comprises one or more elements having six electrons in their outer electronic shells.

31. The method of claim 29, wherein the passivating species includes one or more elements selected from the group consisting of sulfur (S), selenium (Se) and tellurium (Te).

32. The method of claim 29, wherein the stoichiometric metal nitride thin film comprises one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru) and osmium (Os).

33. The method of claim 29, wherein depositing comprises forming the stoichiometric metal nitride thin film by atomic layer deposition (ALD) or plasma-enhanced atomic layer deposition (PEALD).

34. The method of claim 29, wherein depositing comprises contacting the substrate with alternating and sequential vapor phase pulses of:
    a metal source chemical;
    one or more plasma-excited species of hydrogen; and
    a nitrogen source chemical.

35. A passivated stoichiometric metal nitride film formed over a substrate, the passivated stoichiometric metal nitride film comprising:
    a bottom layer disposed over the substrate, the bottom layer comprising one or more metal species and nitrogen, the bottom layer being defined by a stoichiometric ratio between the one or more metal species and nitrogen, the stoichiometric ratio being approximately equal to one; and
    a top layer comprising the metal species, nitrogen and a passivating species, wherein the passivating species includes one or more elements having six electrons in their outer electronic shells.

36. The passivated stoichiometric metal nitride film of claim 35, wherein the top layer is formed directly on the bottom layer.

37. The passivated stoichiometric metal nitride film of claim 35, wherein the passivating species includes one or more elements selected from the group consisting of sulfur (S), selenium (Se) and tellurium (Te).

38. The passivated stoichiometric metal nitride film of claim 35, wherein the top layer has a thickness of at least one atomic monolayer.

39. The passivated stoichiometric metal nitride film of claim 35, wherein the top layer has a thickness between about 2 Å and 20 Å.

40. The passivated stoichiometric metal nitride film of claim 39, wherein the top layer has a thickness between about 2 Å and 6 Å.

41. The passivated stoichiometric metal nitride film of claim 35, wherein the metal species in the bottom layer has a first oxidation state, the metal species in the top layer has a second oxidation state, the first oxidation state being lower than the second oxidation state.

42. The passivated stoichiometric metal nitride film of claim 41, wherein the second oxidation state is +5 or higher.

43. The passivated stoichiometric metal nitride film of claim 35, wherein the metal species includes at least one metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru) and osmium (Os).

44. The passivated stoichiometric metal nitride film of claim 35, wherein the passivated metal nitride film defines a diffusion barrier in an integrated circuit.

45. The process of claim 35, wherein the substrate is selected from the group consisting of silicon, silica, coated silicon, copper metal, dielectric materials and combinations thereof.

* * * * *

UNITED STATES PATENT AND TRADEMARK OFFICE
CERTIFICATE OF CORRECTION

| | |
|---|---|
| PATENT NO. | : 7,595,270 B2 |
| APPLICATION NO. | : 11/627597 |
| DATED | : September 29, 2009 |
| INVENTOR(S) | : Elers et al. |

Page 1 of 1

It is certified that error appears in the above-identified patent and that said Letters Patent is hereby corrected as shown below:

At column 6, line 49, please remove "tertbutylamidi," and insert therefore, --tertbutylamide,--.

At column 6, line 51, please remove "hydrochloride" and insert therefore, --hydrochloride,--.

At column 12, line 47, in Claim 11, please remove "tertbutylamidi," and insert therefore, --tertbutylamide,--.

At column 12, line 48, in Claim 11, please remove "hydrochloride" and insert therefore, --hydrochloride,--.

Signed and Sealed this

Twentieth Day of April, 2010

David J. Kappos
*Director of the United States Patent and Trademark Office*